United States Patent [19]

Miyasaka

[11] Patent Number: 5,256,882
[45] Date of Patent: Oct. 26, 1993

[54] SIGNAL TRANSMISSION CIRCUIT HAVING A LATCH-UP FUNCTION

[75] Inventor: Hironobu Miyasaka, Kitakyusyu, Japan

[73] Assignee: Kabushiki Kaisha Toshiba, Kawasaki, Japan

[21] Appl. No.: 945,939

[22] Filed: Sep. 17, 1992

[30] Foreign Application Priority Data

Sep. 17, 1991 [JP] Japan .................................. 3-235914

[51] Int. Cl.⁵ .............................................. G02B 27/00
[52] U.S. Cl. .................................... 250/551; 307/311; 250/214 LS
[58] Field of Search ............... 250/551, 205, 214 LS, 250/216, 214 SW, 214 A, 239, 221, 222.1; 307/311

[56] References Cited

U.S. PATENT DOCUMENTS

| | | | |
|---|---|---|---|
| 4,521,681 | 6/1985 | Inaba et al. | 250/205 |
| 4,972,089 | 11/1990 | Stevenson | 250/551 |
| 5,189,307 | 2/1993 | Fabian | 250/551 |

*Primary Examiner*—David C. Nelms
*Assistant Examiner*—Que T. Le
*Attorney, Agent, or Firm*—Foley & Lardner

[57] ABSTRACT

A signal transmission circuit having a latch-up function has a first and a second photo-couplers, each of which has a photo-diode (light emitting diode) and a photo-transistor. The photo-diode in the first photo-coupler is series-connected with the photo-transistor in the second photo-coupler between high and low voltage supplies. The other photo-diode and photo-transistor in said first and second photo-couplers are connected in the same way. As a result, signals are transmitted between those two photo-couplers with a high noise resistance.

11 Claims, 5 Drawing Sheets

F1~F3    F4~F6

SIGNAL TRANSMISSION CIRCUIT HAVING A LATCH-UP FUNCTION

BACKGROUND OF THE INVENTION

1. Field of the Invention

This invention relates to a signal transmission circuit having a latch-up function in which signals are transmitted between an input and an output terminals, which are electrically insulated to each other.

2. Description of the Prior Art

In a signal transmission circuit which requires electric insulation between its input and output terminals, such as a solid state relay (referred to as SSR, below), the output part of the circuit is comprised of transistors, thyristers, two-way thyristers (triak), MOSFETs, or the like. In such SSR circuits, a thyrister coupler 1 shown in FIG. 6 and a triac coupler 2 shown in FIG. 7 have a latch-up function in which an output signal is kept on when the input signal has been turned off.

In the coupler shown in FIGS. 6 or 7, the light from a photo-diode 3, which is provided in its input part, triggers thyrister 4 or triac 5 which is provided in its output part, thus allowing thyrister 4 or triac 5 to conduct. This results in a continuous current flow in a load 7 connected between an output terminal 6 and a high voltage supply $V_{cc}$. Load 7 is, thus, driven by the current.

In said couplers, their noise resistance (dv/dt) for a surge current is not high enough, so that a snubber circuit 8, which includes a resistor and a capacity, must be connected with output terminal 6 in order to increase the noise resistance.

In said couplers, however, a leakage current flows through snubber circuit 8 connected with output terminal 6, even in an ordinary state. This leakage current badly affects the circuit operation. Further, although a snubber circuit is provided in the circuit, there is a limit in its noise resistance. This circuit cannot, therefore, be used in a circuit which requires a high noise resistance.

As described above, the prior art SSR circuits having a latch-up function require external structures to improve their noise resistance. These external structures, however, generate a leakage current which badly affects the circuit operation. Although said external structures to improve the noise resistance are provided in said SSR circuit, there is still a limit in ability of improving the noise resistance of this circuit.

SUMMARY OF THE INVENTION

This invention has been made to overcome the above mentioned problems of the prior art circuits.

Therefore, the objective of the present invention is to provide a signal transmission circuit which has a latch-up function and a higher noise resistance than that of the prior art circuit, without adding any external structures.

Another objective of the present invention is to provide a signal transmission circuit which has a latch-up function and a high noise resistance, as well as an ability to drive a heavy load.

Still other objective of the present invention is to provide a signal transmission circuit which has a latch-up function and a high noise resistance, under the application of an AC voltage.

The first aspect of the present invention provides a signal transmission circuit, which is comprised of the following: first light emitting means; first light receiving means which are triggered to conduct by a light emitted from said first light emitting means; second light emitting means which are series-connected with said first light receiving means between a high voltage supply and a low voltage supply; second light receiving means which are triggered to conduct by a light emitted from said second light emitting means, and which are series-connected with said first light emitting means between said high voltage supply and said low voltage supply; a load which is inserted between said first light emitting means and said high voltage supply; a signal input terminal which is provided at the connecting point between said first light receiving means and said second light emitting means; and a signal output terminal which is provided at the connecting point between said first light emitting means and said second light receiving means.

According to the first aspect of the present invention, an input signal applied to the input terminal causes the second light emitting means to light, thus allowing the second light receiving means and the first light emitting means to conduct. The first light emitting means, therefore, cause an emission, allowing the first light receiving means to conduct. Accordingly, if said input signal is removed from the input terminal, the load is continuously driven.

The second aspect of the present invention provides the signal transmission circuit mentioned above, wherein said second light receiving means are comprised of a photo-transistor and a transistor which is Darlington-connected with said photo-transistor.

According to the second aspect of the present invention, the circuit can drive a large capacity of load which requires a large amount of driving current.

The third aspect of the present invention provides the signal transmission circuit mentioned above, wherein said first light emitting means are comprised of two photo-diodes (light emitting diodes) parallel connected with each other in the reverse direction, and wherein said second light receiving means are comprised of a photo-MOSFET.

According to the third aspect of the present invention, a load which should be driven by AC current can be coupled into said signal transmission circuit.

These and other objectives, features, and advantages of the present invention will be more apparent from the following detailed description of preferred embodiments in conjunction with the accompanying drawings.

DETAILED DESCRIPTION OF EMBODIMENTS

Figure 1:
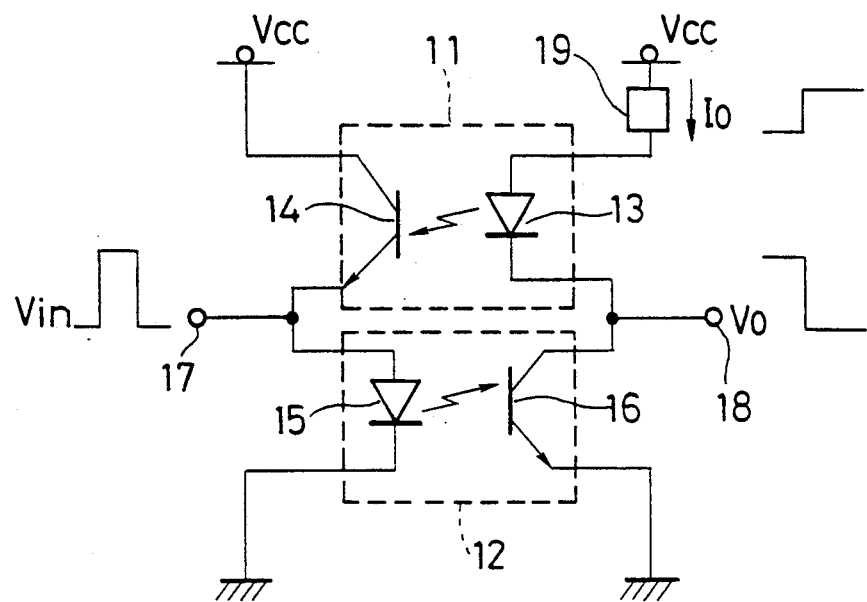
FIG. 1 is a schematic diagram of the signal transmission circuit according to the first embodiment of the present invention.

As shown in FIG. 1, a signal transmission circuit is comprised of two sets of photo-couplers 11 and 12. The first photo-coupler 11 has a photo-diode 13 to emit a light and a photo-transistor 14 to receive the light. In the same manner, the second photo-coupler 12 has a photo-diode 15 to emit a light and a photo-transistor 16 to receive the light.

In these photo-couplers 11 and 12, photo-transistor 14 in the first photo-coupler 11 is series-connected with photo-diode 15 in the second photo-coupler 12 between a high voltage supply $V_{cc}$ and the ground. Similarly, photo-diode 13 in the first photo-coupler 11 is series-connected with photo-transistor 16 in the second photo-coupler 12 between high voltage supply $V_{cc}$ and the ground.

In said structure, signals are input from the middle point 17 (referred to as input terminal, below) of series-connected photo-transistor 14 and photo-diode 15. Also, output signals are obtained from the middle point 18 (referred to as output terminal, below) of series-connected photo-diode 13 and photo-transistor 16. A load 19 to be driven is connected between the high voltage supply $V_{cc}$ and photo-diode 13.

When a pulse signal is applied to input terminal 17 in said circuit, current flows through photo-diode 15 in the second photo-coupler 12, allowing diode 15 to luminese. As a result, photo-transistor 16 in the second photo-coupler 12 becomes conductive. Once photo-transistor 16 has become conductive, current flows from high voltage supply $V_{cc}$ to the ground via load 19, photo-diode 13 in the first photo-coupler 11, and photo-transistor 16 in the second photo-coupler 12, allowing photo-diode 13 to luminese. Thus, photo-transistor 14 in the first photo-coupler 11 becomes conductive.

In said situation, when the input signal turns off, that is, a low level signal is applied to input terminal 17, photo-couplers 11 and 12 keep their functions to emit and receive light. Thus, the load current keeps flowing. In other words, although the input signal is taken away from terminal 17, load 19 is kept to be driven, thus realizing a latch-up function. On the other hand, in order to dissolve the latch-up function, input terminal 17 is made to be the ground level. At this time, photo-diode 15 stops its emission, causing photo-transistor 16 to become non-conductive.

Figure 6:
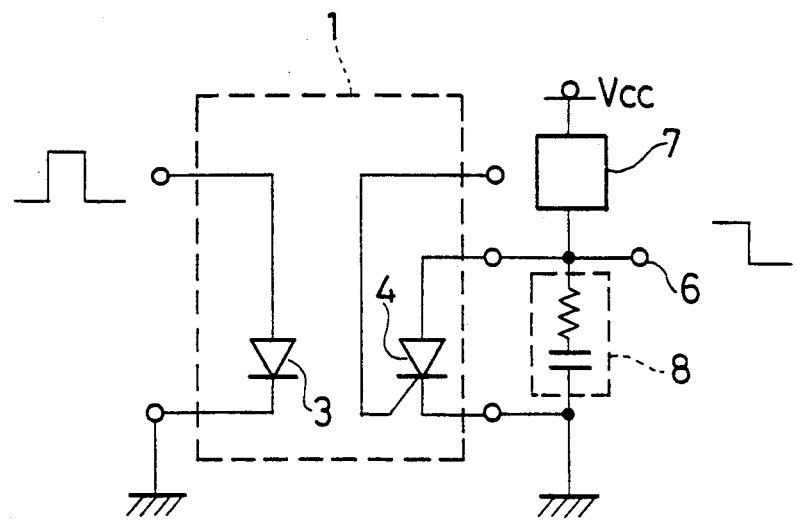
FIGS. 6 and 7 are schematic diagrams of the signal transmission circuits according to prior arts of this invention.
Figure 7:
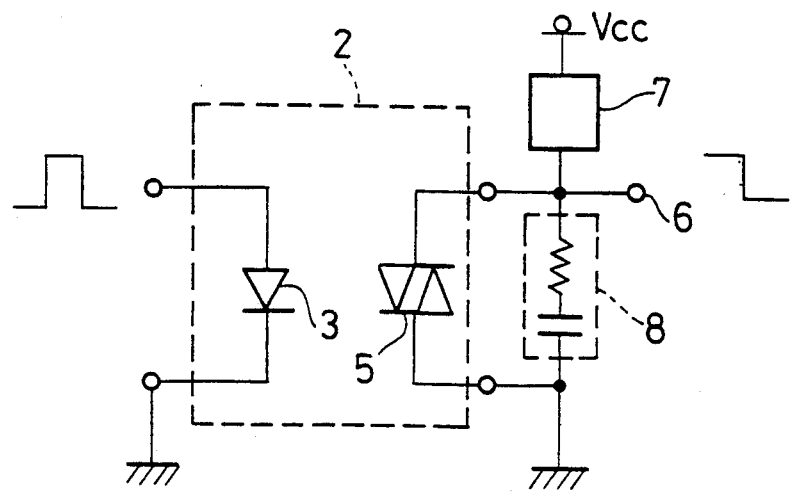

As mentioned above, in the signal transmission circuit having a latch-up function as shown in FIG. 1, signals are transmitted between the input and the output terminals, each of which is insulated to the other. Consequently, the noise resistance, which is generated by an abrupt voltage change in this circuit, can be greatly improved as compared with conventional couplers such as thyristor coupler 1 shown in FIG. 6 and triac coupler 2 shown in FIG. 7. In fact, the noise resistance (dv/dt) of 2000 V/μs has been realized in the circuit according to said embodiment, while the noise resistances of 10 V/μs for the conventional thyristor coupler and of 500 V/μs for the conventional triac coupler have been obtained.

As illustrated above, the circuit of this embodiment is simple in its structure as compared with the conventional circuit, because no circuit to absorb noise, such as a snubber circuit, is required in this circuit. Further, a leakage current, which is generated by said additional circuit, cannot be generated in the circuit of this embodiment, because this circuit does not have said additional circuit. Therefore, the circuit characteristic of this embodiment is free from the bad affection caused by said leakage current.

Next, the second and the third embodiments of the present invention will be described below.

Figure 2:
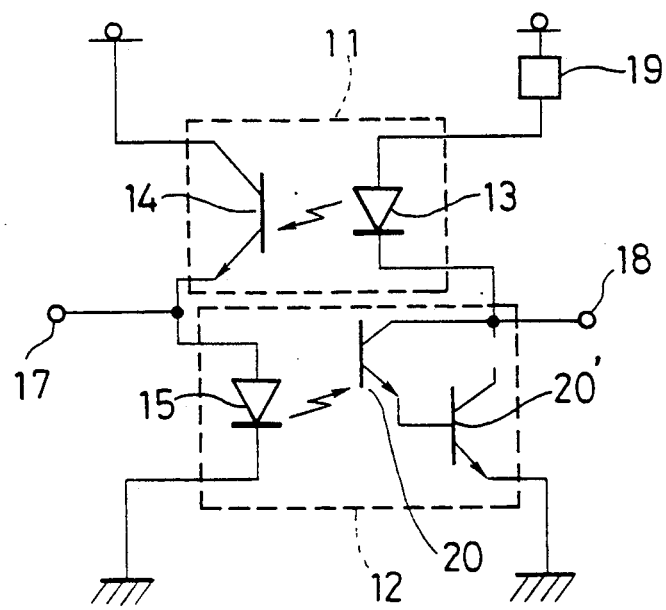
FIG. 2 is a schematic diagram of the signal transmission circuit according to the second embodiment of the present invention.
Figure 3:
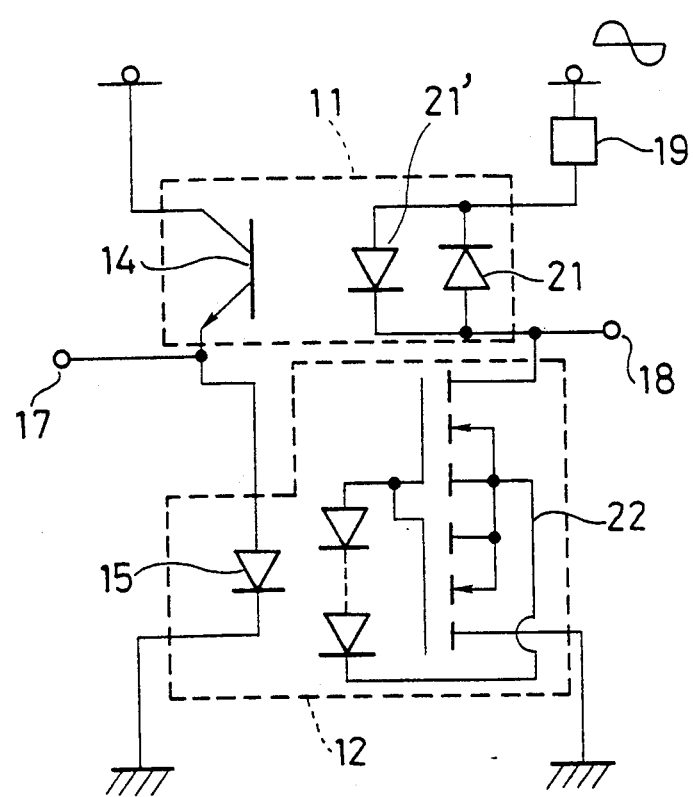
FIG. 3 is a schematic diagram of the signal transmission circuit according to the third embodiment of the present invention.

FIG. 2 shows the circuit structure of a signal transmission circuit according to the second embodiment of the present invention. In FIG. 2 and FIG. 3 (illustrated below), the same numbers as those shown in FIG. 1 indicate the same structure elements so that their explanation will be omitted.

The second embodiment shown in FIG. 2 is characterized by the following fact. That is, photo-transistor 16 in the second photo-coupler 12 shown in FIG. 1 is replaced by a photo-transistor 20 which is Darlington-connected to the other transistor 20' as shown in FIG. 2. In this structure, it is clear that the same advantage as that of the first embodiment is obtained. In addition, because of the Darlington connection, a load 19 having a larger capacity can be driven in this structure.

FIG. 3 shows the structure of a signal transmission circuit according to the third embodiment of the present invention. This embodiment is characterized by the following fact. That is, photo-diode 13 in the first photo-coupler 11 shown in FIG. 1 is replaced by photo-diodes 21 and 21', which are connected parallel in the reverse direction with each other, and photo-transistor 16 in the second photo-coupler 12 shown in FIG. 1 is replaced by a photo-MOSFET 22 as shown in FIG. 3. As a result of this structure, the same advantage as that of the first embodiment is obtained. In addition, load 19 can be connected to an AC power supply in this embodiment. Thus, a load which should be driven by an AC current can be coupled to this circuit.

The signal transmission circuits mentioned above can be integrated and housed into one package, as shown in FIGS. 4 and 5.

FIG. 4 shows the package structure in which the circuit shown in FIG. 1 or 2 is housed. As shown in FIG. 4a, in the input side of the package, photo-transistor 14 is mounted on frame F1 and photo-diode 15 is mounted on frame F3. These transistor 14 and diode 15 are connected with each other through frame F2. On the other hand, photo-diode 13 and photo-transistor 16 or 20 are mounted on frame F5 in the output side of the package. Also, one terminal of photo-diode 13 is connected to frame F6 and one terminal of photo-transistor 16 or 20 is connected to frame F4, as shown in the figure.

Figure 4A:
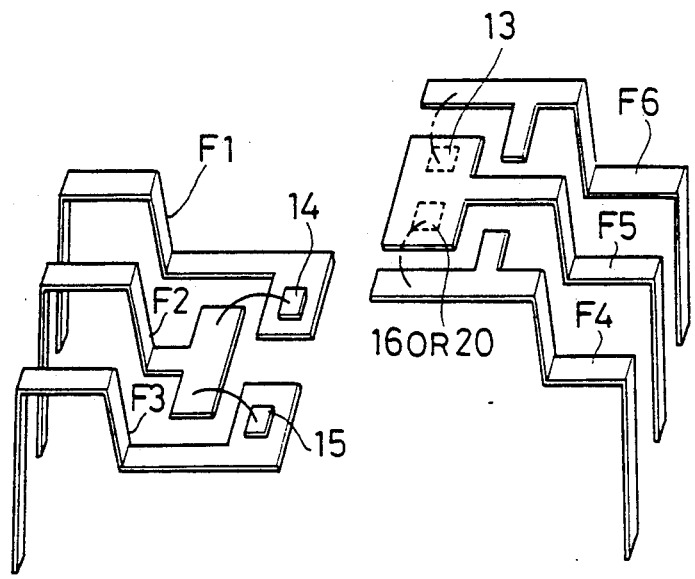
FIGS. 4a, 4b, 4c, and 4d illustrate the package structure of the circuit shown in FIG. 1 or FIG. 2.
Figure 4B:
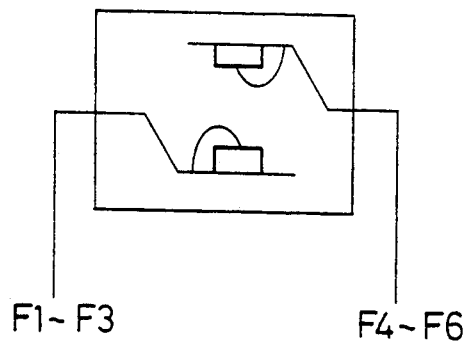
Figure 4C:
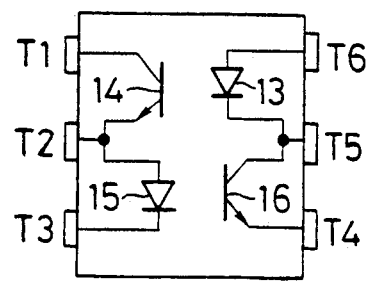
Figure 4D:
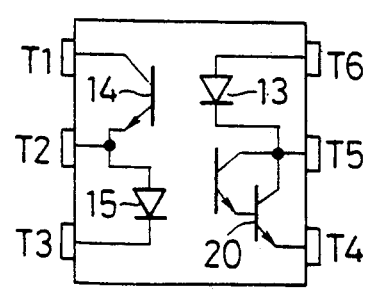

These frames are housed in a package as shown in FIG. 4b. Frames F1, F2, and F3 in the input side and Frames F4, F5, and F6 in the output side stand opposite to each other in the up and down direction. As a result, as shown in FIG. 4c or 4d, the circuit is housed in the package having six terminals T1, T2, T3, T4, T5, and T6.

Figure 5A:
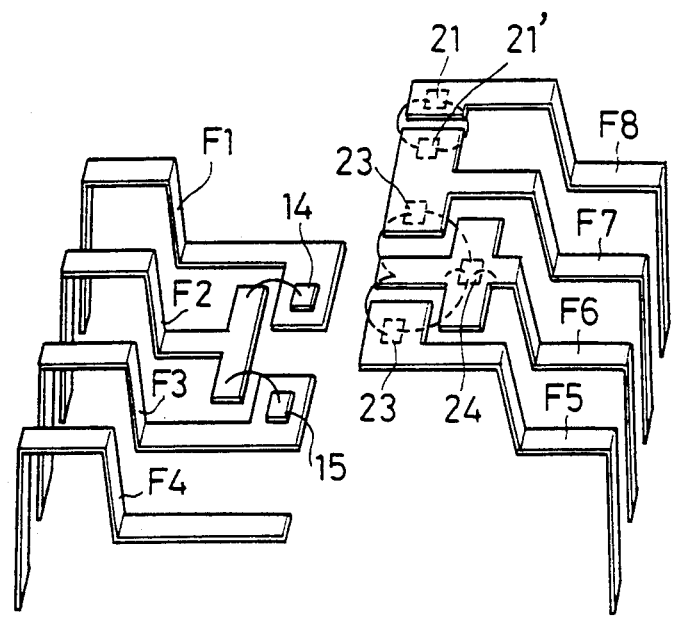
FIGS. 5a, 5b, and 5c illustrate the package structure of the circuit shown in FIG. 3.

FIG. 5 shows the package structure in which the circuit shown in FIG. 3 is housed. As shown in FIG. 5a, the input side of the package is constructed in the same manner as that shown in FIG. 4a. On the other hand, photo-diodes 21 and 21', which are parallel-connected with each other in the reverse direction, are mounted on frames F7 and F8 respectively. Further, MOSFETs 23 and 23' are mounted on frames F5 and F6, and a series of photo-diode 24 are mounted on frame F6. These MOSFETs 23 and 23' and photo-diodes 24 make up photo-MOSFETs 22 shown in FIG. 3.

Figure 5B:
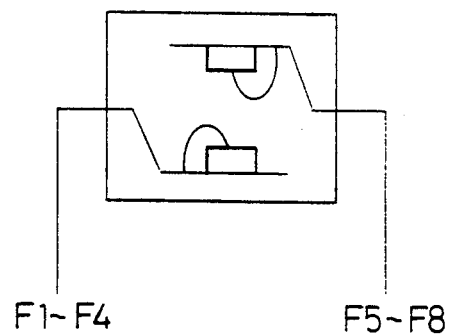
Figure 5C:
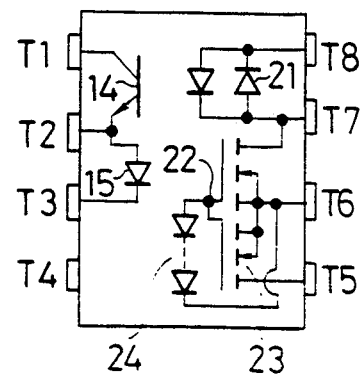

Those frames are housed in a package as shown in FIG. 5b. Frames F1, F2, F3, and F4 in the input side and frames F5, F6, F7, and F8 stand opposite to each other in the up and down direction. As a result, as shown in FIG. 5c, the circuit is housed in the package having eight terminals T1 to T8.

As illustrated above, the circuit of this invention is housed in one package, and no additional circuit to improve the noise resistance is needed. As a result, this circuit is easy to handle.

In summary, the input part of a circuit according to the present invention is comprised of the light receiving part of a first photo-coupler and the light emitting part of a second photo-coupler, and said parts are series-connected to each other. Further, the output part of said circuit is comprised of the light emitting part of the first photo-coupler and the light receiving part of the second photo-coupler, and these parts are series-connected to each other to drive and control a load. Consequently, the noise resistance of this circuit can be greatly improved without adding any external structure. This invention, therefore, provides a signal transmission circuit having a latch-up function and a high noise resistance.

What is claimed is:

1. A signal transmission circuit, comprising:
   first light emitting means;
   first light receiving means which is triggered to conduct by a light emitted from said first light emitting means;
   second light emitting means which is series-connected with said first light receiving means between a high voltage supply and a low voltage supply;
   second light receiving means which are triggered to conduct by a light emitted from said second light emitting means, and which are series-connected with said first light emitting means between said high voltage supply and said low voltage supply;
   a load which is inserted between said first light emitting means and said high voltage supply;
   a signal input terminal which is provided at the connecting point between said first light receiving means and said second light emitting means; and
   a signal output terminal which is provided at the connecting point between said first light emitting means and said second light receiving means.

2. The signal transmission circuit as claimed in claim 1, wherein said first and second light emitting means are comprised of photo-diodes.

3. The signal transmission circuit as claimed in claim 1, wherein said first and second light receiving means are comprised of photo-transistors.

4. The signal transmission circuit as claimed in claim 1, wherein said second light receiving means are comprised of a photo-transistor which is Darlington-connected with another transistor.

5. The signal transmission circuit as claimed in claim 1, wherein said all structure elements are housed into one package.

6. The signal transmission circuit as claimed in claim 5, wherein said first light emitting means and said first light receiving means are placed face to face in each opposite side of the package so as to construct a first photo-coupler, and wherein said second light emitting means and said second light receiving means are placed face to face in each opposite side of said package so as to construct a second photo-coupler.

7. A signal transmission circuit, comprising:
   two light emitting diodes parallel connected with each other in the reverse direction;
   a photo-transistor which is triggered to conduct by a light emitted from either one of said two light emitting diodes,
   a third light emitting diode which is series-connected with said photo-transistor between a high voltage supply and a low voltage supply;
   at least one photo-MOSFET which is triggered to conduct by a light emitted from said third light emitting diode, and which is series-connected with said parallel-connected light emitting diodes between said high voltage supply and said low voltage supply;
   a load which is inserted between said parallel-connected light emitting diodes and said high voltage supply;
   a signal input terminal which is provided at the connecting point between said photo-transistor and said third light emitting diode; and
   a signal output terminal which is provided at the connecting point between said parallel-connected light emitting diodes and said photo-MOSFET.

8. The signal transmission circuit as claimed in claim 7, wherein said photo-MOSFET is comprised of a series of light receiving diodes and MOSFETs.

9. The signal transmission circuit as claimed in claim 7, wherein said high voltage supply is comprised of an AC power supply.

10. The signal transmission circuit as claimed in claim 7, wherein all said structure elements are housed into one package.

11. The signal transmission circuit as claimed in claim 10, wherein said two light emitting diodes and said photo-transistor are placed face to face in each opposite side of the package so as to construct a first photo-coupler, and wherein said third light emitting diode and said photo-MOSFET are placed face to face in each opposite side of said package so as to construct a second photo-coupler.

* * * * *